(12) United States Patent
Pueschner et al.

(10) Patent No.: US 8,991,711 B2
(45) Date of Patent: Mar. 31, 2015

(54) CHIP CARD MODULE

(75) Inventors: Frank Pueschner, Kelheim (DE); Jens Pohl, Bernhardswald (DE); Juergen Hoegerl, Regensburg (DE); Wolfgang Schindler, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 13/552,660

(22) Filed: Jul. 19, 2012

(65) Prior Publication Data
US 2014/0021264 A1    Jan. 23, 2014

(51) Int. Cl.
| G06K 19/06 | (2006.01) |
| H01L 21/48 | (2006.01) |
| H01L 23/498 | (2006.01) |
| H01L 23/31 | (2006.01) |
| H01L 23/00 | (2006.01) |

(52) U.S. Cl.
CPC ........ *H01L 21/4853* (2013.01); *H01L 21/4857* (2013.01); *H01L 23/3121* (2013.01); *H01L 23/49811* (2013.01); *H01L 23/49838* (2013.01); *H01L 23/4985* (2013.01); *H01L 23/49855* (2013.01); *H01L 23/49866* (2013.01); *H01L 24/48* (2013.01); *H01L 2224/16238* (2013.01); *H01L 2224/45147* (2013.01); *H01L 2224/48091* (2013.01); *H01L 2224/48229* (2013.01); *H01L 2224/48465* (2013.01); *H01L 2224/48472* (2013.01); *H01L 2224/49171* (2013.01); *H01L 2224/49175* (2013.01); *H01L 2224/73204* (2013.01); *H01L 2224/73265* (2013.01); *H01L 2924/00* (2013.01); *H01L 2924/00014* (2013.01)

USPC ............................ 235/492; 235/486; 235/487

(58) Field of Classification Search
USPC ......................................... 235/486, 487, 492
See application file for complete search history.

(56) References Cited

U.S. PATENT DOCUMENTS

| 6,882,541 | B2* | 4/2005 | Maruyama et al. ............ 361/752 |
| 7,019,981 | B2 | 3/2006 | Heinemann et al. | |
| 7,090,139 | B2* | 8/2006 | Kasuga et al. ................. 235/494 |
| 7,605,453 | B2 | 10/2009 | Stampka et al. | |
| 2004/0256150 | A1 | 12/2004 | Barchmann et al. | |

FOREIGN PATENT DOCUMENTS

| DE | 19728693 A1 | 1/1999 |
| DE | 40400449 | 7/2004 |
| DE | 10311696 A1 | 10/2004 |
| EP | 000209903 A1 | 10/2004 |
| EP | 1468398 B1 | 6/2005 |
| EP | 1415271 B1 | 10/2005 |
| EP | 1428260 B1 | 3/2006 |

OTHER PUBLICATIONS

English Abstract of DE19728693 A1. Jan. 14, 1999.
English Abstract of EP1468398 B1. Jun. 1, 2005.
(Continued)

*Primary Examiner* — Karl D Frech

(57) ABSTRACT

In various aspects of the disclosure, a chip card module is provided. The chip card module may include a flexible substrate having a metallization on a first and second major surface, or side, thereof. An integrated circuit affixed to the second side is oriented with chip pads facing away from the substrate. Wire bonds may connect the chip pads to the metallizations.

16 Claims, 5 Drawing Sheets

(56) References Cited

OTHER PUBLICATIONS

English Abstract of DE10311696 A1. Oct. 7, 2004.
DIN EN ISO/IEC 7810, Identifikationskarten, Physikalische Eigenschaften, Deutsches Institut fuer Normung e.V., Jun. 1997, pp. 1-7.
International Standard ISO/IEC 7816-1, Indentification cards—Integrated circuit(s) Cards with contacts—Part 1: Physical characteristics, Oct. 15, 1998, pp. 1-8.
International Standard ISO/IEC 7816-2, Information technology—Identification cards—Integrated circuit(s) cards with contacts—Part 2: Dimensions and location of the contacts, Mar. 1, 1999, pp. 1-9.
Rankl et al., Handbuch der Chipkarten, 3. Auflage, Hanser Fachbuch, Mar. 25, 1999, pp. 1-849.
Haghiri et al., Vom Plastik zur Chipkarte, Hanser Fachbuch, Oct. 28, 1999, pp. 1-285.

* cited by examiner

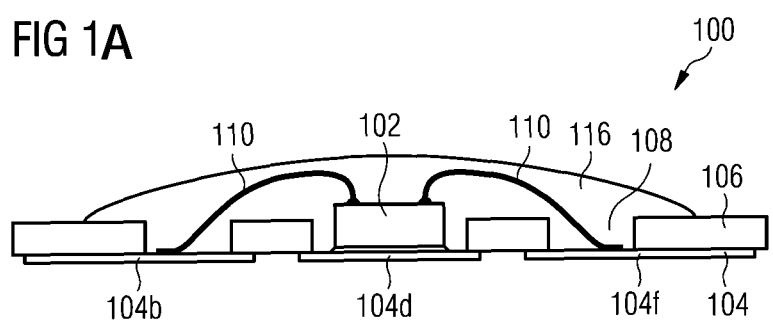
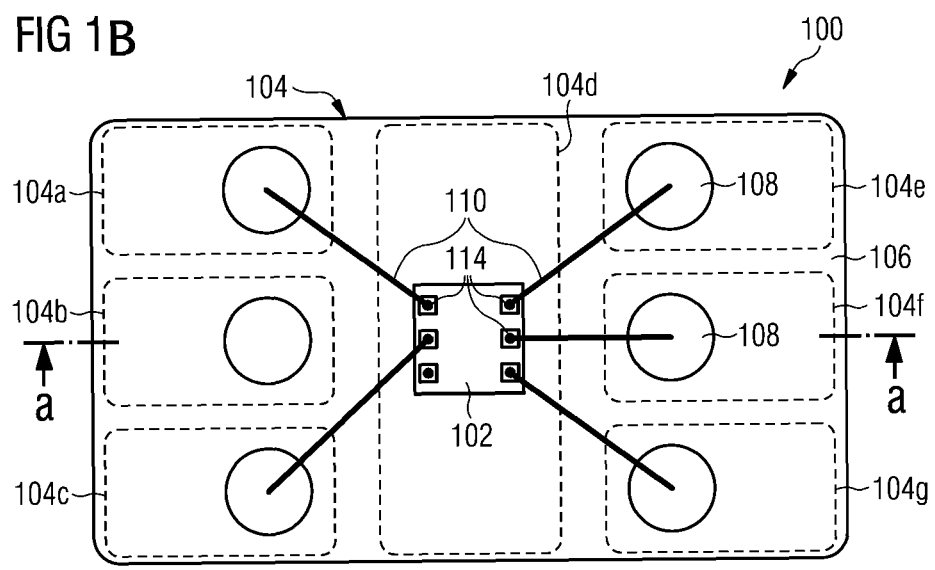

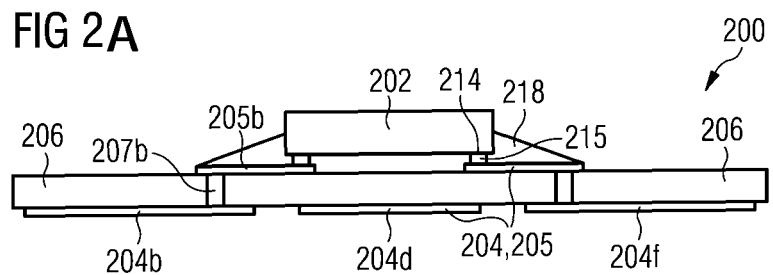
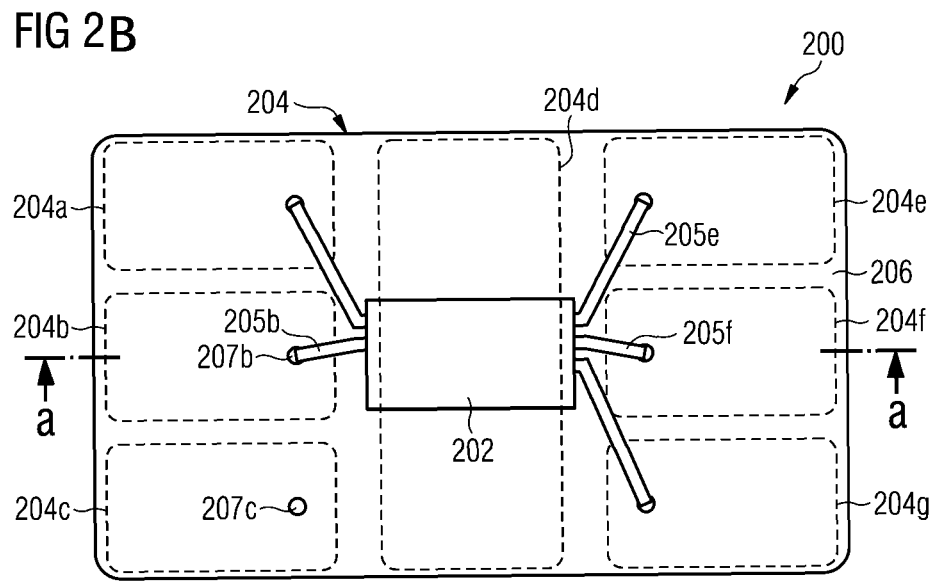

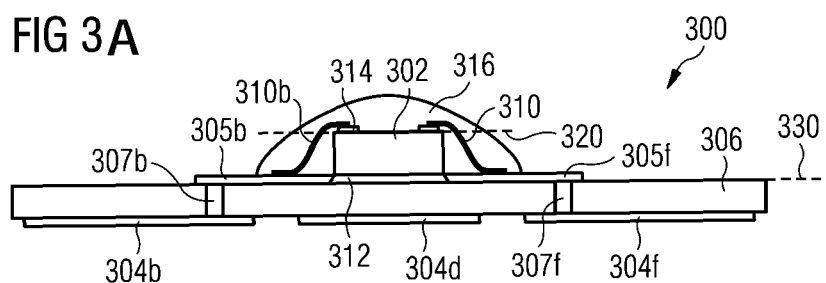
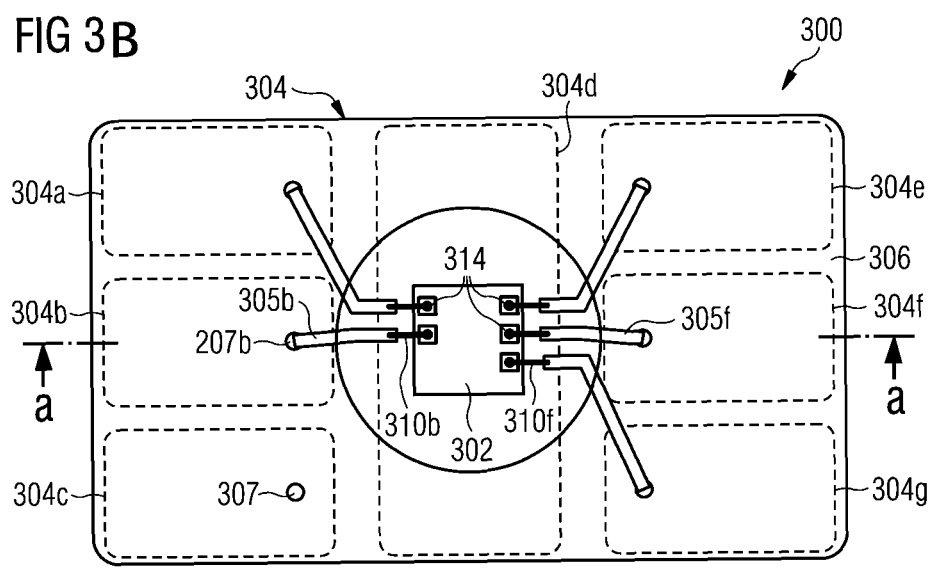

CHIP CARD MODULE

TECHNICAL FIELD

Various aspects of the disclosure relate generally to chip card technology, and more particularly to chip card modules and chip cards having surface contact areas.

BACKGROUND

Chip cards, integrated circuit-containing devices resembling a 'credit card' in size, shape and material, are in widespread use in a large number of application areas. Standardized chip cards, such as those conforming to ISO standard 7816 or ISO 7810 having surface contacts may be used with chip card reading/writing devices across a wide range of applications and manufacturers without difficulty, owing to their standardization.

According to the standard, contact areas are arranged on a predetermined portion of a chip card, the contact areas being connected such as by leads to a semiconductor chip having dimensions suitable for embedding within the standardized chip card. The contact areas, and the chip may be formed in advance, including the relevant connections, the resultant subassembly being referred to as a 'chip module'.

Chip modules provide protection for the integrated circuit against environmental influences, both during manufacture of the chip card in which the chip module is installed, and afterward, when the chip card is in ordinary use. Likewise, chip modules should provide reliable means of interface, such as with card readers/writers, and should be formed of materials that are durable, preferably renewable, and/or cost efficient.

SUMMARY

A chip card module is disclosed with a flat flexible substrate having two major surface, e.g. a front and a back side. A metallization on a first major surface provides at least one discreet electrical contact area. A second metallization on the second major surface forms at least one discreet electrical lead. The contact areas on one side and the leads on the other are connected together by at least one via through the substrate, establishing electrical contact between the metallizations on each side.

A device, such as an integrated circuit mounted to the second major surface, or back side, has at least one electrical contact pad on top, the device affixed to the back side of the substrate such that the contact pad(s) face away from the substrate. Wires bonded to the contact pads electrically connect the integrated circuit to electric lead(s) on the back side, thereby connecting the integrated circuit to the contact areas on the front side.

According to various aspects of the disclosure, the chip card module is formed at least in part of polyester. Moreover, the substrate may be formed of material, such as plastic, having a melting point below 250 degrees C. More particularly the substrate may be formed of material having a melting point below 200 degrees C. Still more particularly, the substrate may be formed of material having a melting point below 150 degrees C.

According to a further aspect of the disclosure, the bond wire may be formed at least in part of aluminum. Likewise, contact surfaces, such as those on the front side or first major surface, can be provided at least in part without any gold. More particularly, all the contacts on the front side may be free of gold, substantially free of gold, or may contain only trace quantities of gold.

According to a still further aspect of the disclosure, where the device on the back side of the substrate is an integrated circuit, the contact pads may be oriented in a single plane. This plane may be parallel, generally parallel, substantially parallel or within 10 degrees of parallel with the plane of the back side. More particularly, the metallizations, or electrical leads on the second major surface may also be formed in a single plane. The plane of the contact pads may be parallel, generally parallel, substantially parallel, or within 10 degrees of parallel with the plane of the electrical leads on the back side of the substrate.

According to a still further aspect of the disclosure, an encapsulation may be provided covering the bond wires connecting the contact pads to the back side metallizations, or electrical leads. A lead radius may be defined as an area extending from the contact pads of the device and at least one via connecting front and back side metallizations. According to a further aspect of the disclosure, the encapsulation may be provided over an area having a radius (the encapsulation radius) that is smaller than that of the lead radius.

According to an aspect of the present disclosure, a method for manufacturing a chip card module is disclosed. The method may include depositing a first metallization on a first major surface, or front side, of a flexible substrate, depositing a second metallization on a second major surface, or back side of the substrate, establishing electrical contact between the first and second metallization, affixing an integrated circuit on the second major surface of the flexible substrate, the integrated circuit having a plurality of chip pads facing away from the second, or back side and bonding wire between the chip pads and the second metallization.

In further aspects of the disclosure, the method may include encapsulating the bonded wire. Further, the chip pads may be oriented in a plane parallel, substantially parallel, or less than 10 degrees from parallel with the second major surface. Thus, the disclosed bonding may take place without rotating-head technology.

In a still further aspect of the disclosure, the method may include a substrate formed of polyester, and wherein bonding takes place at less than 150 degrees C.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various aspects of the disclosure are described with reference to the following drawings, in which:

FIGS. 1A-B show a chip module employing a first construction;

FIGS. 2A-B shows a chip module employing an alternative construction;

FIGS. 3A-C shows a chip module employing a construction according to an aspect of the disclosure;

DESCRIPTION

Figure 3C:
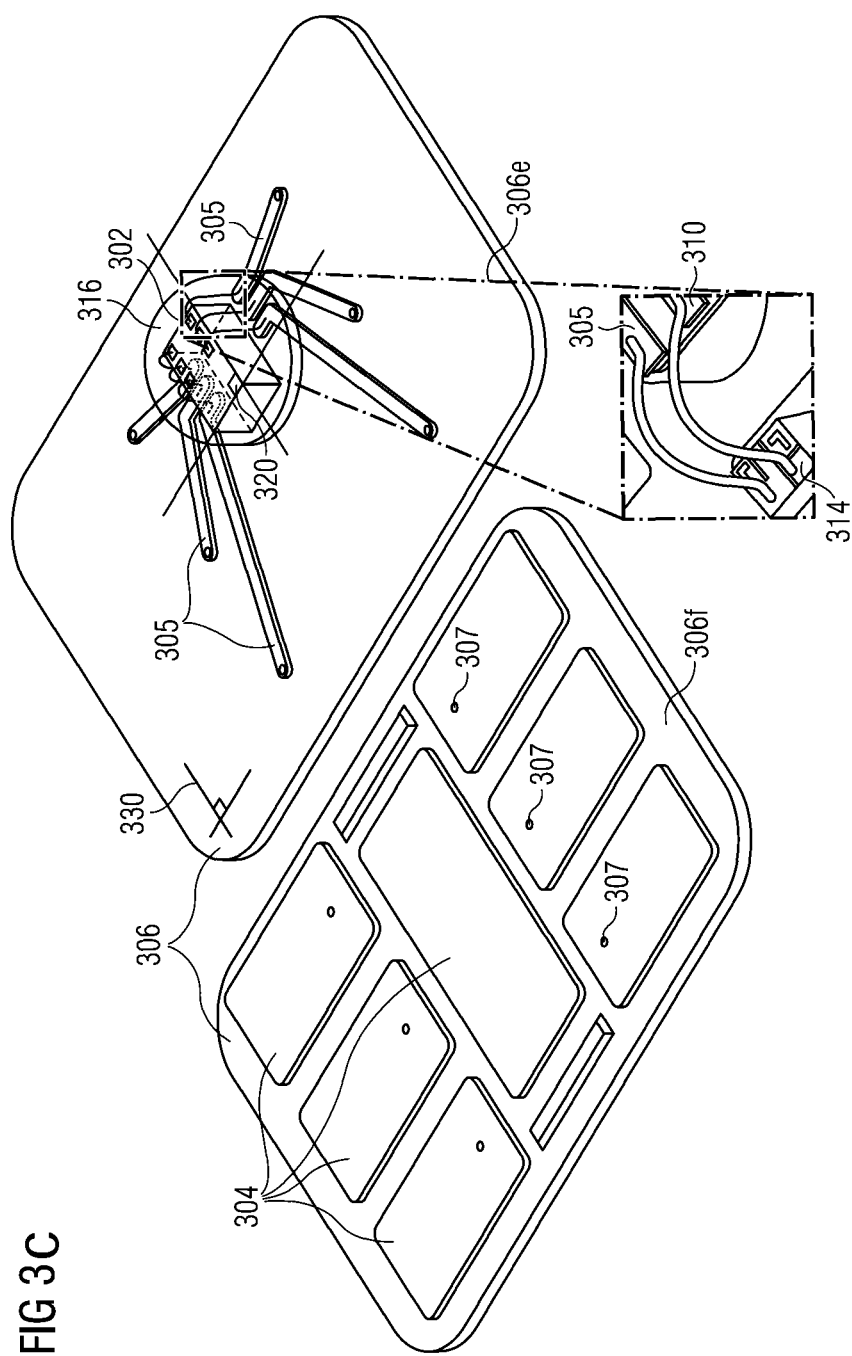

The following detailed description refers to the accompanying drawings that show, by way of illustration, specific details and aspects of the disclosure in which the aspects of the disclosure may be practiced. These aspects of the disclosure are described in sufficient detail to enable those skilled in the art to practice it. Other aspects of the disclosure may be utilized and structural, logical, and electrical changes may be made without departing from the scope of the disclosure. The various aspects of the disclosure are not necessarily mutually exclusive, as some aspects of the disclosure can be combined with one or more other aspects of the disclosure to form new aspects of the disclosure. The following detailed description therefore is not to be taken in a limiting sense, and the scope of the present disclosure is defined by the appended claims.

Various aspects of the disclosure are provided for devices, and various aspects of the disclosure are provided for methods. It will be understood that basic properties of the devices also hold for the methods and vice versa. Therefore, for sake of brevity, duplicate description of such properties may be omitted.

The term "at least one" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The term "major surface" used interchangeably with "front side" and "rear side" or simply "side" or "first" and "second" side such as of a tape-like or card-like substrate is meant to indicate the two surfaces of such structure having substantially more surface area than the side surfaces extending across the thickness of the substrate.

FIG. 1 shows chip module 100, also known as a chip-on-flex module having chip 102, typically between 150-200 microns in thickness, mounted to a back side of contact array 104, the contact array formed of one or a plurality of metalized contact surfaces, shown here individually as 104a-g. Module 100 is structurally supported by carrier substrate 106, commonly epoxy tape formed of fiber-reinforced epoxy having a thickness, for example, of approximately 110 microns. Ideally, the tape is provided in rolls (not shown) to facilitate sequential processing of multiple modules.

Contact surfaces of array 104, arranged on the front of module 100 may be formed of laminated copper, for example between 30-35 microns in thickness. To facilitate electrical contact therewith, the contact surfaces of 104 may be galvanically nickel and/or gold plated. Such plating provides a contact array 104 that resists oxidation and other influences deleterious to reliably establishing electrical contact therewith, such as by a chip card reader (not shown).

Holes 108 may be stamped in tape 106, such as during a lamination process, exposing the back of the contacts of array 104. Wires 110 extend from chip 102 to respective contacts 104a-g, establishing an electrical connection therebetween. Typically, wires 110 may be formed of gold, and may be affixed to respective contact pads 114 on chip 102, and to the contacts of array 104 by application of thermosonic bonding. In particular, a pick & place/diebonding machine affixes chip 102 to the back of module 100 such as with adhesive 112, whereupon wires 110, for example having a diameter between 20-25 microns, are bonded by the application of about 150 degrees Celcius to the bond site, concurrent with application of ultrasonic accoustic energy to physically secure the wire in electrical contact therewith. Variations of this process may be known as thermosonic bonding. More recently copper wire of similar diameter has been bonded between chip and contact in this manner.

Globe top covering 116 is provided to protect the chip, wire and contact structures from damage due to exposure to the environment. The resulting module typically has a thickness of about 600 microns.

The material used for epoxy tape 106 must be able to withstand the thermosonic process. In particular, selection of tape 106 requires material that is sufficiently temperature stable to withstand the application of heat during thermosonic bonding.

The module of FIG. 1 also calls for use of precious materials, such as gold, in the form of gold bond wires 110 and gold plating on contact surfaces. Selective application of gold, for example only to limited areas of the contact requires extra process steps that may add more expense than can be saved in material costs.

Additionally, module 100 of FIG. 1 requires globe top covering across the entire area over which bond wires 110 are suspended, which is a substantial fraction of the width of module 100. The length of bond wires 110 is also related to the sensitivity of module 100 to damage as a result of expansion or flexing of the module. In particular, longer bond wires 110, combined with the globe top 116 needed to cover them both contribute to mechanical stresses that can lead to module failure.

FIG. 2 shows chip module 200, also known as a flip chip-on-substrate/flex module having chip 202, typically between 250-330 microns in thickness, mounted to a back side of carrier substrate 206, commonly polyester (PET) or other highly flexible material. By contrast to chip module 100, chip module 200 has metallizations 204, 205 located on both the front (contact) and back (chip) sides of carrier substrate 206, respectively. In particular, contact array 204 formed of one or a plurality of metalized contact surfaces or metallizations, shown here individually as 204a-g is formed on the front side of carrier substrate 206. Metallizations 205 are provided on the back of carrier substrate 206.

Metallizations 204 and 205 are typically formed of copper about 10 microns in thickness. The copper may be galvanically plated with 2 microns of nickel and/or optionally 0.03 microns of gold. Metalizations 204 and 205 may be photolithographically formed on the front and back of carrier substrate 206. Discrete contacts on either side are shown electrically connected to each other through carrier substrate 206 by vias 207. For example, metallization 205b is shown connected to contact surface metallization 204b by via 207b.

Chip 202 has contacts 214 provided with electrically conductive bumps 215. Again by contrast to module 100, chip 202 of module 200 is mounted with its contacts 215 facing toward carrier substrate 206 in an upside-down or "flipped" orientation whereby bumps 215 are aligned with respective metallizations 205. Chip 202 is held in place relative to metallizations 205 using an underfiller material 218, such as NCP.

This flip-chip configuration is compatible with a wider range of substrate materials, such as PET, which is not as thermally stable as epoxy tape 106. In particular, the configuration of module 200 is compatible with low-temperature processes using diebond techniques. The securing of chip 202 with a non-conducting adhesive likewise limits thermal exposure to carrier substrate 206 during fabrication of module 200. Through control of time, temperature and pressure, damage to the temperature sensitive PET material can be limited, or prevented.

Module 200 lacks altogether the bond wires found in module 100. Module 200 therefore may be more robust, depending on the likelihood of wire breakage due to flexing, bending torque, tension or pressure applied to the module during use.

Also, there is no corresponding need for encapsulation such as by globe top covering 116. It may also be possible to limit or eliminate the need for expensive materials such as gold, and/or the time-consuming steps of layering materials on the metalized surfaces.

FIG. 3 shows a chip module 300 according to an aspect of the disclosure. A carrier substrate 306, which is flexible and may be made of PET-based material such as FCOS™ tape. FIG. 3C illustrates the front 306f and rear 306r of carrier substrate 306, wherein an array of contacts 304 for an ISO standard chip card have been provided in the form of metallization, applied such as by photolithography. Contacts 304 may be formed of copper having a thickness of 10 microns, nickel/gold coated, for example with 2 microns of nickel, and 0.03 microns of gold. There may be other coatings in addition to or instead of the nickel/gold coatings disclosed herein.

Rear side 306r of carrier substrate 306 is shown having conductor leads 305 formed as metallizations thereon. Leads 305 may be formed of copper having the same thickness and coatings as contacts 304, and may likewise be formed lithographically. Alternatively, the materials employed for contacts and conductors on respective sides f and r of carrier substrate 306 may be different to each other and/or formed by different means.

FIG. 3A is a cross-section of module 300 at line a-a indicated in FIG. 3B. The cross-sectional orientation of the metallization is shown. In particular, leads 305b and 305f can be seen in detail positioned directly opposite contacts 304b and 304f, respectively. Vias 307 establish an electrical connection between respective metallizations on the front and rear sides of carrier substrate 306. For example, vias 307b and 307f extend through carrier substrate 306 to establish contact between corresponding leads and contacts.

Chip 302 is held in place on the rear side of carrier substrate 306 by die glue 312. As shown in FIGS. 3A-B, chip 302 is oriented with chip pads 314 facing away from carrier substrate 306, and such that the chip pads 314 are positioned generally proximal to corresponding ends of leads 305. For example, as shown in FIG. 3B, chip 302 is positions such that chip pad 314b is proximal to lead 305b.

Bond wires 310 are shown extending from chip pads 314 to corresponding leads 305. Bond wires 310 may be aluminum wire having a thickness between 20-25 microns, the bond wires being attached, for example, by aluminum wedge-wedge bonding technology. In particular, use of aluminum bonding techniques involving application of acoustic or ultrasonic energy to bond wires 310 to bond them to chip pads 314 and to metallizations on chip card surface 306, such as leads 305 can be accomplished without application of temperatures outside an acceptable temperature range for substrate 306.

More particularly, according to an aspect of the disclosure, a polyester (PET) substrate, having limited resistance to temperature, for example above 150 degrees Celsius, could advantageously be utilized with wedge-wedge bonding technology, by contrast to a thermosonic bonding technique that employs temperatures outside the tolerance of the substrate. It will be recognized that the wedge-wedge bonding technique employed within aspects disclosed in FIG. 3 may be applied to any substrate appropriate to chip card module construction, including epoxy-based substrates, without regard to their resistance to temperatures typically associated with thermosonic bonding including polyethylene, polypropylene, polyvinylchloride or polycarbonate.

According to another aspect of the disclosure, production of chip card modules can be carried out according to the construction disclosed in FIG. 3 without the necessity to change production techniques as a result of a change, for example in substrate materials. Likewise, any appropriate material used for bond wires 310 including aluminum or for metallized leads 305 including [Ni, Au, Pd, Ag can be employed without substantial modification of production equipment or processes. Material such as Ni, Au, Pd utilized for contacts 304 may also be varied with similar results. For example, contacts without gold plating, or any gold component may be advantageously employed. Therefore, according to an aspect of the present disclosure, in particular the construction of FIG. 3 is tolerant of changes in materials as cost, availability and design requirements may dictate.

For example, materials of FIGS. 1 and 2 may be used in combination including without employing a flipped chip orientation. In this sense, advantageous aspects of FIGS. 1 and 2 can be combined. Whereas the 'flipped chip' of FIG. 2 substitutes bumps 215 and metallization 204, 205 for bond wires 110 of FIG. 1, it may be advantageous to employ wirebond technology with metallizations as shown in FIG. 3. For example, use of bond wires, including aluminum or other materials, to establish connections between bond pads 314 and metallization on carrier substrate 306 combines the double-sided structured metallization of the flip-chip configuration of FIG. 2 with wirebonding, albeit using advantageously different or less expensive materials or processes.

A rotary-head wirebond apparatus, for example, can provide multiple-axis movement necessary to achieve bonding of wire 110 of FIG. 1. However, according to an aspect of the disclosure, wedge-wedge bonding technology may be employed without use of a rotary head. In particular, through application of a wire angle of less than 10 degrees, for example between chip pads 314 and respective metallizations 305 more particularly, $0°\pm7.5°$. Such application may avoid implementation of otherwise costly rotating head process technologies.

Likewise, shorter lengths of bond wires 310, in particular limited to the distance from chip pads 314 to metallizations 305 provide a smaller radius of protection required for relatively delicate bonding structures. As shown in FIG. 3, therefore, globe top 316 is provided within a smaller volume when compared to globe top 116 of FIG. 1. More particularly, because bond wires 110 extend from chip 102 all the way to holes 108, the diameter of globe top 116 is much larger than globe top 316 (given a standard ISO chip module implementation). By contrast, globe top 316 may protect delicate structures such as wiring though it extends only as far as the interface between bond wires 310 and metallizations 305. A smaller globe top region may, depending on the materials used, reduce cost of manufacture, and/or may increase the robustness of the chip card module. Moreover, underfiller 218, as shown in flip-chip implementation 200 of FIG. 2 may be omitted in chip module 300 of FIG. 3.

According to a still further aspect of the present disclosure, substitution of materials, such as less precious metals for gold, and/or elimination of process steps such as plating of contact or bonding areas may also be advantageously implemented.

Figure 4:
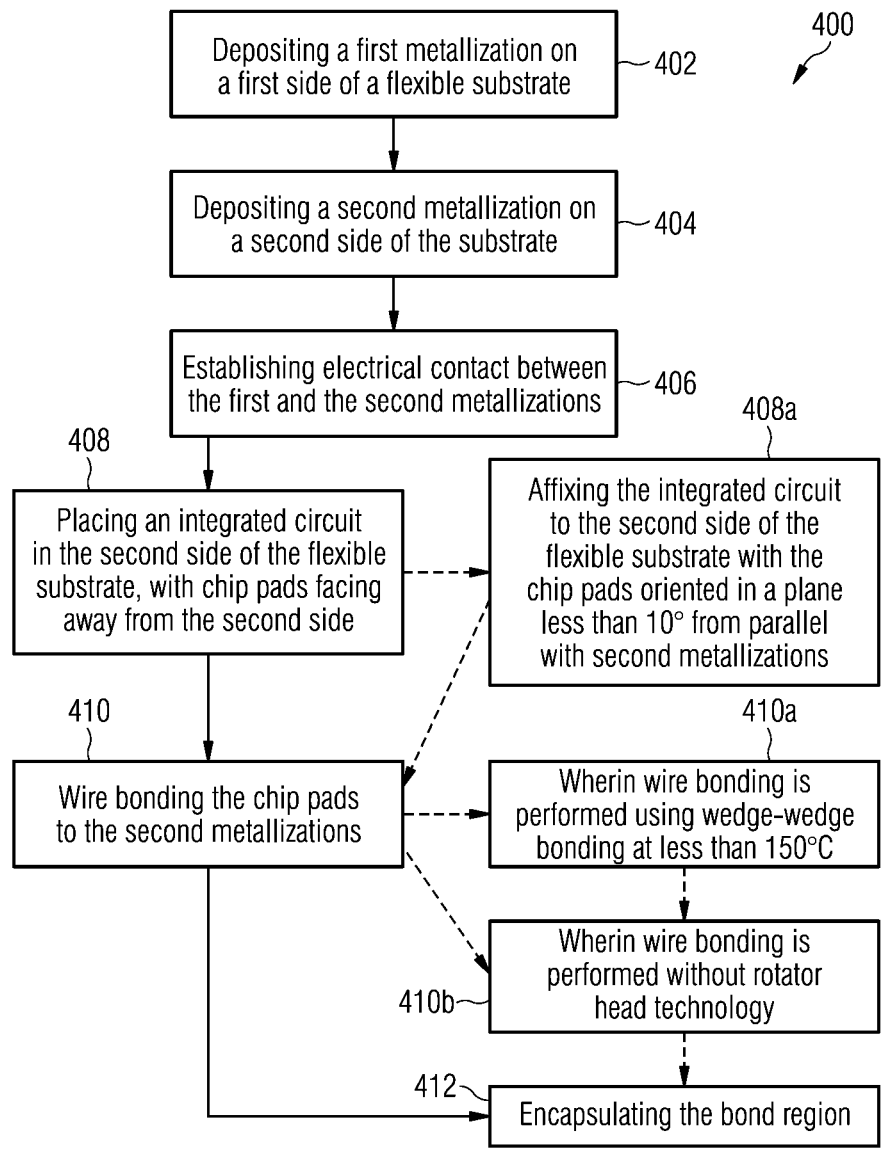
FIG. 4 shows a method of manufacture of a chip module according to an aspect of the disclosure.

A method 400 in of manufacture of a chip card module is disclosed in FIG. 4. In particular, the method includes 402, depositing a first metallization on a first side of a flexible substrate. For example, FIG. 3 discloses a chip card module using polyester (PET) material for carrier substrate 306. Consistent with 402, the first side of the substrate may for example be provided with one or an array of contacts 304.

In 404, depositing a second metallization on a second side of the substrate may include providing one or more structured metallizations in the form of, for example leads 305 shown in FIG. 3. Likewise, 406, establishing electrical contact between at least one of the first and second metallizations can be accomplished by formation, for example, of contacts through the substrate. An example of such contact is shown in FIG. 3 as vias 307.

In 408, placing an integrated circuit on the second side of the flexible substrate advantageously includes facing the chip pads of the integrated circuit away from the second side, i.e. in the un-flipped orientation shown in FIGS. 1 and 3. Optionally, in 408a, the integrated circuit can be affixed to the second side of the flexible substrate with the chip pads oriented in a plane less than 10 degrees from parallel with the second metallizations.

Wire bonding is performed in 410. In particular, wire bonds connecting chip pads to their respective second metallizations establishes electrical contact between the chip pads and the second metallizations, and in accordance with 406, therethrough to first metallisations. The wire bonding step may be accomplished according to 410a using wedge-wedge bonding technology at a temperature of less than for example 150° C. Additionally, to the extent that the chip pads are oriented in a plain less than 10 degrees from parallel with the plain of the second metallizations, as provided in 408a, 410b discloses wire bonding, such as wire bonding performed using wedge-wedge bonding technology, however performed without rotating head technology.

In accordance with 412, the bond region (which ordinarily includes the chip and its wire bonds) are encapsulated such as by a globe top covering.

With particular reference to the chip module structure disclosed in FIG. 3, 400 discloses a method which results in a chip module structure incorporating features that function together to increase functionality of the chip module and/or to decrease the costs of material and/or production. For example, where flexible substrate 306 has specific temperature sensitivity, such as a polyester substrate, 410 optionally provides 410a wherein wire bonding is used which does not employ temperatures above 150° C., thus matching the production technique (i.e. wedge-wedge bonding) to the substrate employed. Likewise, a person of skill in the art will recognize that wedge-wedge bonding may be employed with other temperature ranges depending upon the temperature sensitivity characteristics of the substrate. Furthermore, for example, 408 optionally provides affixing the integrated circuit such that the plane of the second metallization (e.g. plane 330 of FIG. 3C) is within 10 degrees of parallel to the plane occupied by the chip pads (e.g. plane 320 of FIG. 3C). This orientation enables 410b insofar as wire bonding can be performed without rotating head technology provided the proper relative orientation between the surfaces to be joined by wire bonding is maintained. Likewise, bonding technologies requiring different angles of relative orientation, either more or less than 10 degrees are contemplated as within the disclosure of 400.

It is to be understood that 400 discloses a flexible manufacturing process for a chip card module that may incorporate one or more cost saving features of the chip card 300 as disclosed in FIG. 3. The advantages of any single material substitution or omission may be made consistent with the design requirements for a specific chip card module and that the flexibility in design is particularly supported by the combinability of selected features from the structures disclosed in FIGS. 1 and 2 in addition to the application of specific reduction technologies that may be incompatible with one or more aspects of FIGS. 1 and 2. For example, structure 300 does not employ a flipped chip. Accordingly wedge-wedge bonding can be successfully employed, and the specific requirements of the flipped chip configuration can be omitted. Likewise, the introduction of second metallizations as in 404, allows for shorter bond wire lengths, a smaller bond region requiring encapsulation, and, provided proper orientation is maintained according to 408a, preferred wire bonding technologies may be employed.

A person skilled in the art will recognize that combinations of the above exemplary embodiments may be formed. While the invention has been particularly shown and described with reference to specific aspects of the disclosure, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip card module comprising:
a flexible substrate having a first and second major surface;
a first metallization on said first major surface providing at least one discreet electrical contact area;
a second metallization on said second major surface forming at least one discreet electrical lead;
at least one via establishing electrical contact between said first metallization and said second metallization;
a device mounted to said second major surface, the device having at least one electrical contact pad disposed thereon, said contact pad facing away from the second major surface; and
at least one bond wire electrically connecting said contact to said electrical lead.

2. The chip card module of claim 1, wherein said flexible substrate is formed of at least in part of polyester.

3. The chip card module of claim 2, wherein said bond wire is formed at least in part of aluminum.

4. The chip card module of claim 3, wherein said electrical contact area is provided at least in part without any gold.

5. The chip card module of claim 4 wherein said integrated circuit comprises a plurality of contact pads oriented in a first plane, and wherein said second metallization comprises a plurality of electrical leads oriented in a second plane, the first and second planes being oriented within 10 degrees of parallel to each other.

6. The chip card of claim 5 wherein an encapsulation is provided covering said plurality of bond wires.

7. The chip card module of claim 6 wherein a distance between one of said plurality of contact pads and one of said at least one via defines a lead radius and wherein said encapsulation is defined by a radius less than that of the lead radius.

8. The chip card module of claim 2 wherein said device is an integrated circuit.

9. The chip card module of claim 1 wherein said substrate has a melting point less than 260 degrees Celsius.

10. The chip card module of claim 9 wherein said substrate has a melting point less than 200 degrees Celsius.

11. A method for manufacturing a chip card module comprising:
depositing a first metallization on a first major surface of a flexible substrate;
depositing a second metallization on a second major surface of the substrate;
establishing electrical contact between the first and second metallization;
affixing an integrated circuit on the second major surface of the flexible substrate, the integrated circuit having a plurality of chip pads facing away from said second major surface; and bonding wire between the chip pads and the second metallization.

12. The method of claim 11 further comprising encapsulating the bonded wire.

13. The method of claim 12 wherein at least one of the plurality of chip pads is oriented in a plane less than 10 degrees from parallel with the second major surface.

14. The method of claim 13 wherein said bonding takes place at less than 150 degrees Celsius.

15. The method of claim 14 wherein said bonding takes place without rotating head technology.

16. The method of claim 14 wherein the substrate is polyester.

* * * * *